US005602595A

United States Patent [19]
Citta et al.

[11] Patent Number: 5,602,595
[45] Date of Patent: Feb. 11, 1997

[54] ATV/MPEG SYNC SYSTEM

[75] Inventors: Richard W. Citta, Oak Park; Mark Fimoff, Hoffman Estates; Timothy G. Laud, Mundelein, all of Ill.

[73] Assignee: Zenith Electronics Corporation, Glenview, Ill.

[21] Appl. No.: 479,428

[22] Filed: Jun. 7, 1995

Related U.S. Application Data

[63] Continuation-in-part of Ser. No. 417,581, Apr. 6, 1995, which is a continuation-in-part of Ser. No. 175,061, Dec. 29, 1993, abandoned.

[51] Int. Cl.$^6$ ...................................................... H04N 5/04
[52] U.S. Cl. .......................... 348/495; 348/423; 348/471
[58] Field of Search .................................. 348/423, 426, 348/495, 384, 390, 464, 461, 471, 467; 370/94.1, 94.2; 375/286; H04N 7/00, 5/04

[56] References Cited

U.S. PATENT DOCUMENTS

| | | | |
|---|---|---|---|
| 5,072,449 | 12/1991 | Enns et al. | 370/94.2 |
| 5,396,497 | 3/1995 | Veltman | 370/94.2 |
| 5,486,864 | 1/1996 | Zdepski | 348/423 |
| 5,534,938 | 7/1996 | Citta et al. | 348/495 |

Primary Examiner—Victor R. Kostak

[57] ABSTRACT

An ATV system encodes variable length elementary streams of data into a multilevel symbol signal comprising a plurality of multiplexed fixed length data packets without sync information. The fixed length data packets are arranged in fields of repetitive data segments, each of which includes a data segment sync and each field of which includes a field sync. The fields of data segments are transmitted as suppressed carrier VSB modulation. In an ATV receiver, the data segment sync is used to generate a timing signal that identifies the beginning of each fixed length data packet. In one embodiment, a packet sync signal is inserted into each recovered fixed length data packet for recovering the elementary streams of data. In another embodiment, recovery of the elementary streams of data is accomplished without inserting a packet sync signal.

26 Claims, 4 Drawing Sheets

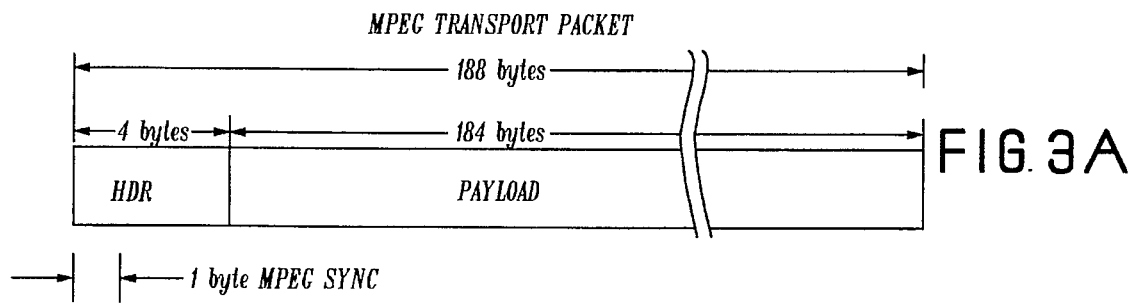
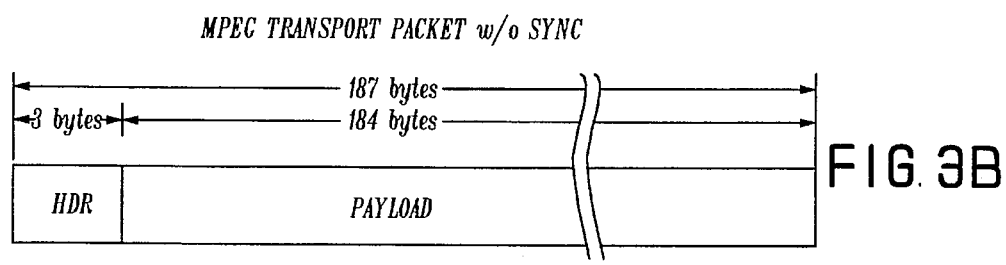
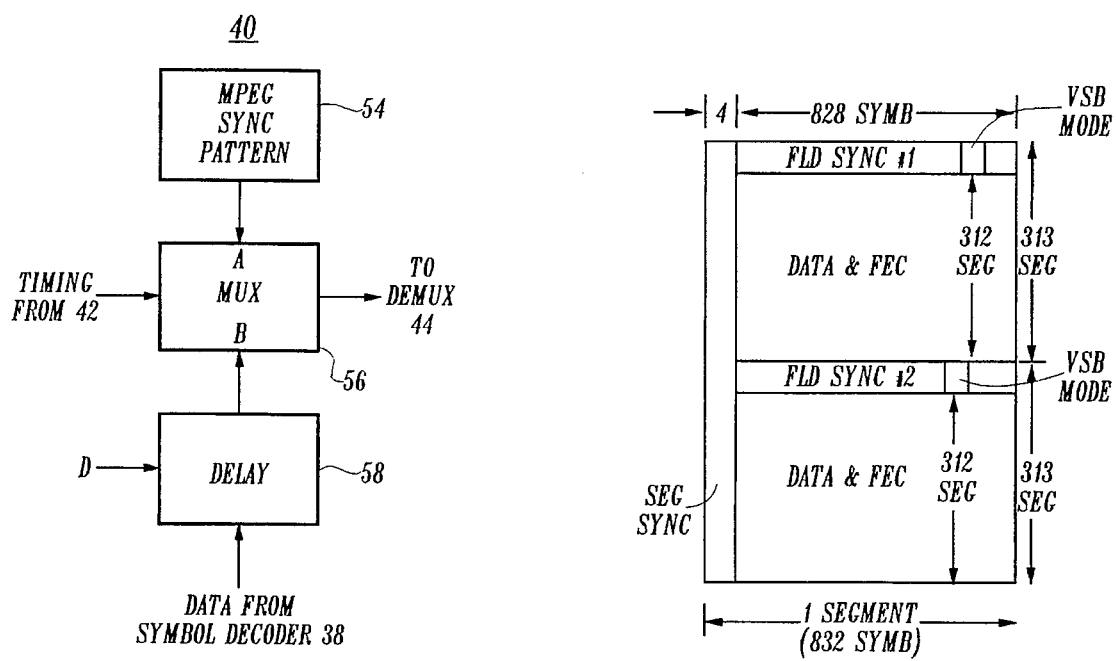

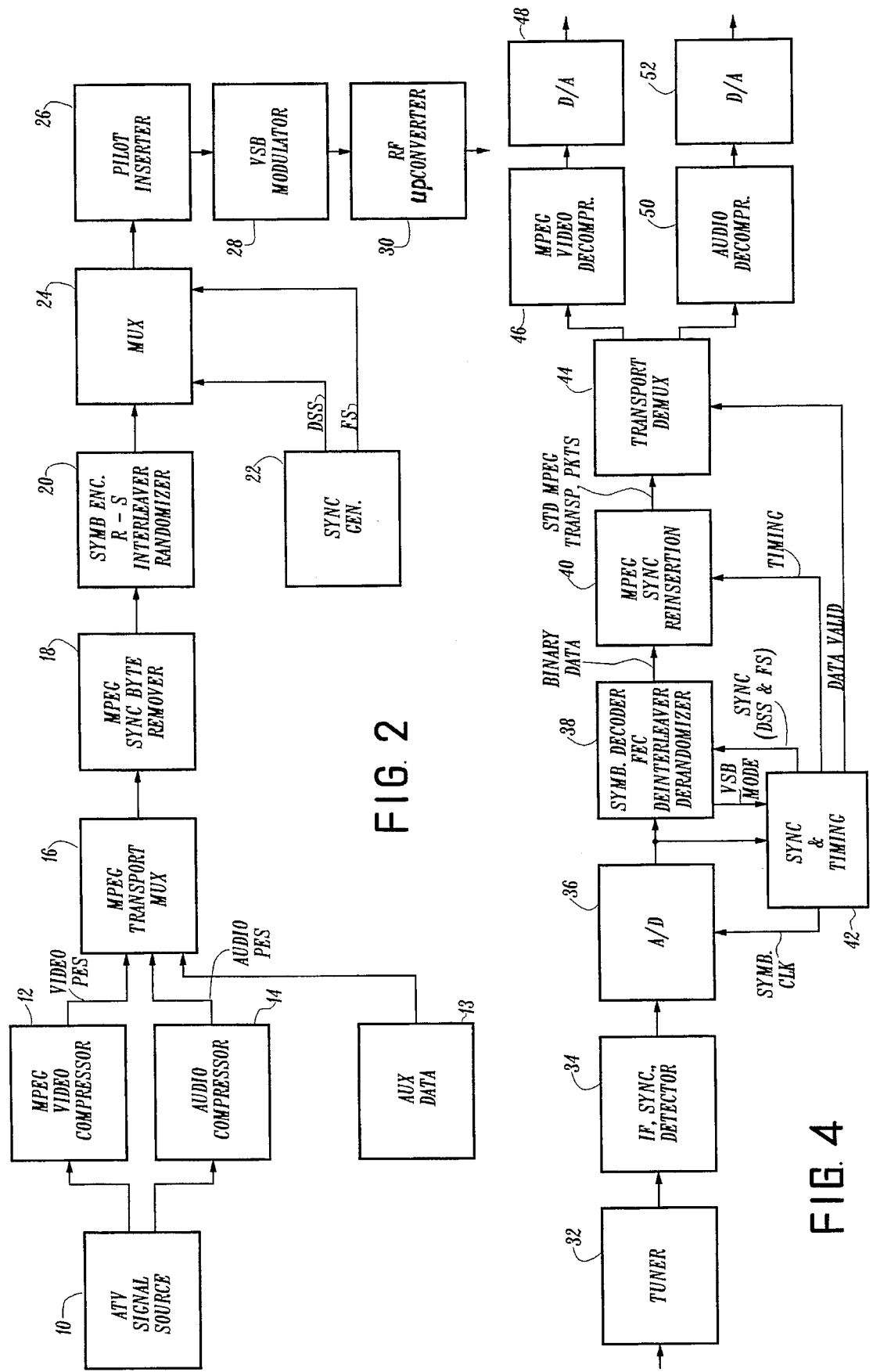

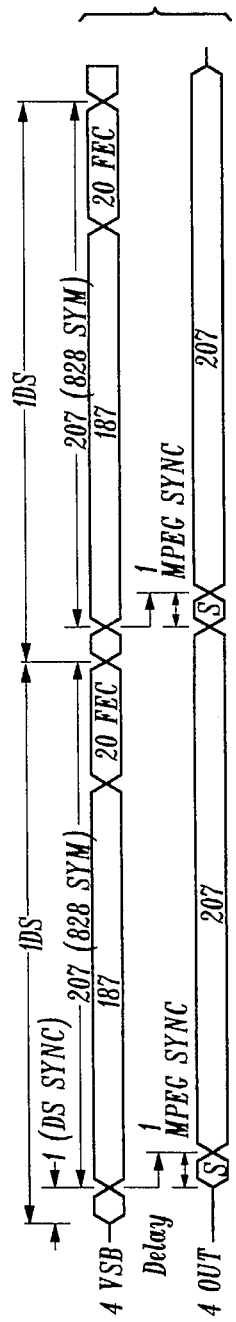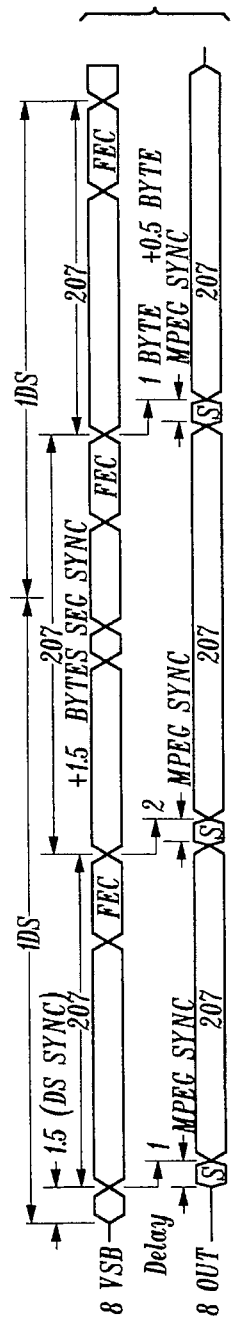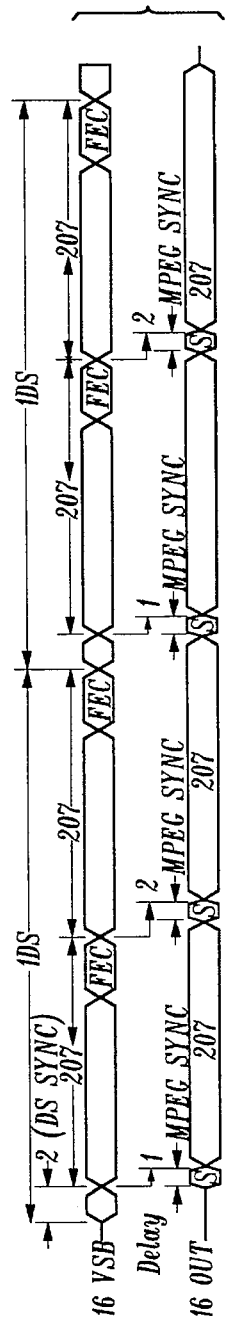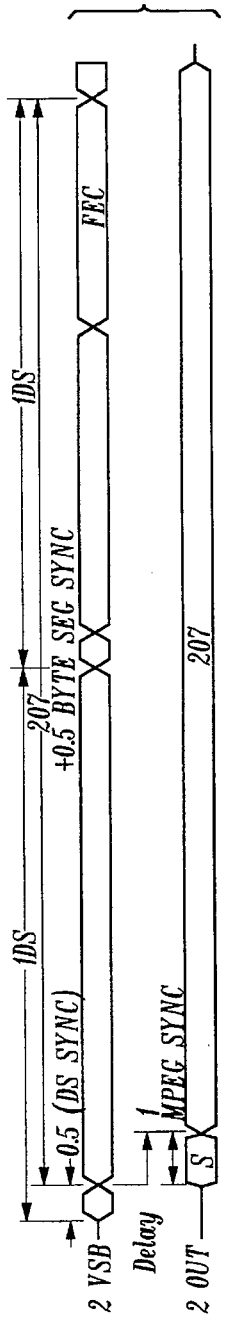

ATV/MPEG SYNC SYSTEM

CROSS REFERENCE TO RELATED APPLICATIONS

This application is a continuation-in-part of application Ser. No. 08/417,581, filed Apr. 6, 1995, which is a continuation-in-part of application Ser. No. 08/175,061, filed Dec. 29, 1993 now abandoned.

BACKGROUND OF THE INVENTION AND PRIOR ART

This invention relates generally to a system for transmitting data in MPEG (Motion Picture Experts Group) packet form and specifically to a system for increasing the efficiency of such transmissions. The MPEG packets may comprise encoded video, audio or auxiliary data.

According to the MPEG standard, variable length packetized elementary streams (PES) of data are arranged into fixed length transport packets for transmission. Each MPEG packet comprises a 4 byte header followed by 184 bytes of payload (188 byte packet). The header includes a sync byte (corresponding to 47 HEX) and a 13 bit packet identifier (PID). The 188 byte transport packets are multiplexed for transmission over any suitable transmission medium. The proposed United States standard for advanced television (ATV), which includes both high definition television (HDTV) and lower than HDTV resolution signals, contemplates the transmission of MPEG transport packets using a digital multilevel VSB transmission system. The VSB transmission system in both terrestrial and 2/4/8/16-level cable modes is characterized by a data frame illustrated in FIG. 1. The frame comprises two data fields of 313 data segments each, with each data segment comprising 832 multilevel symbols. The first data segment in each field comprises a data field sync segment and each data segment is headed by a four symbol data segment sync followed by 828 data and FEC (forward error correction) symbols. The field and segment sync symbols facilitate recovery of the data in the ATV receiver and provide timing signals that identify the beginning of each frame and segment. Each field sync segment also includes information identifying the VSB mode.

The transmission is via suppressed carrier modulation. Three hundred and ten kilohertz from the lower band edge, a small DC pilot is added to the signal for use by the VSB receiver in achieving carrier lock. All payload data is randomized to insure that random data is transmitted even when constant data is being supplied to the system. The data and FEC bytes are interleaved for added protection against burst errors.

The symbol rate is 4.5/286 MHz×684 which is approximately 10.76 MHz. It will be appreciated that the first term, 4.5/286 is the NTSC horizontal scan rate. All transmitted signals are multilevel. The sync symbols are always 2-level (binary). In the terrestrial mode, 8 level trellis-coded symbols (3 bits per symbol) are transmitted while for the cable mode, 16/8/4/2-level symbols (4/3/2/1 bits per symbol, respectively) are used. These are referred to as trellis coded 8 VSB for the terrestrial mode and 16/8/4/2 VSB for the cable mode. In the 16 VSB cable mode, each segment includes four 2-level sync symbols plus 414 data bytes (828×4÷8). In the 8 VSB cable and trellis modes, each segment includes four 2-level sync symbols plus 310.5 data bytes. In the 4 VSB cable mode, each segment includes four 2-level sync symbols plus 207 data bytes. In the 2 VSB cable mode, each segment includes four 2-level sync symbols plus 103.5 data bytes.

The use of MPEG transport packets for the VSB transmission results in an unnecessary redundancy and a reduction of data capacity since both MPEG sync bytes and VSB data segment sync symbols are included. The purpose of the MPEG sync byte is to identify the beginning of a packet and the same information can be derived from the segment sync in VSB. Moreover, the information can be derived very conveniently due to the VSB parameters, i.e. symbols/segment and bits/symbol.

OBJECTS OF THE INVENTION

A principal object of the invention is to provide a novel ATV transmission and reception system.

Another object of the invention is to provide an improved system for transmission and reception of digital data.

A further object of the invention is to provide a novel digital transmission system utilizing MPEG transport packets.

A still further object of the invention is to avoid the above-mentioned inefficiency in utilizing MPEG transport packets in VSB transmissions.

BRIEF DESCRIPTION OF THE DRAWINGS

These and other objects and advantages of the invention will be apparent upon reading the following description in conjunction with the drawings, in which:

FIG. 1 is an illustration of a VSB frame format;

FIG. 2 is a simplified block diagram of a transmitter constructed in accordance with the invention;

FIGS. 3A and 3B represent the MPEG transport packets as modified in accordance with one aspect of the invention;

FIG. 4 is a simplified block diagram of a receiver for receiving the signals from the transmitter of FIG. 2;

FIGS. 5A, 5B, 5C and 5D illustrate the arrangements of the received signals and the reformulated MPEG transport packets for the FIG. 4 receiver;

FIG. 7 is a block diagram illustrating the MPEG sync reinsertion technique used in the FIG. 4 receiver.

DESCRIPTION OF THE PREFERRED EMBODIMENT

Figure 6:
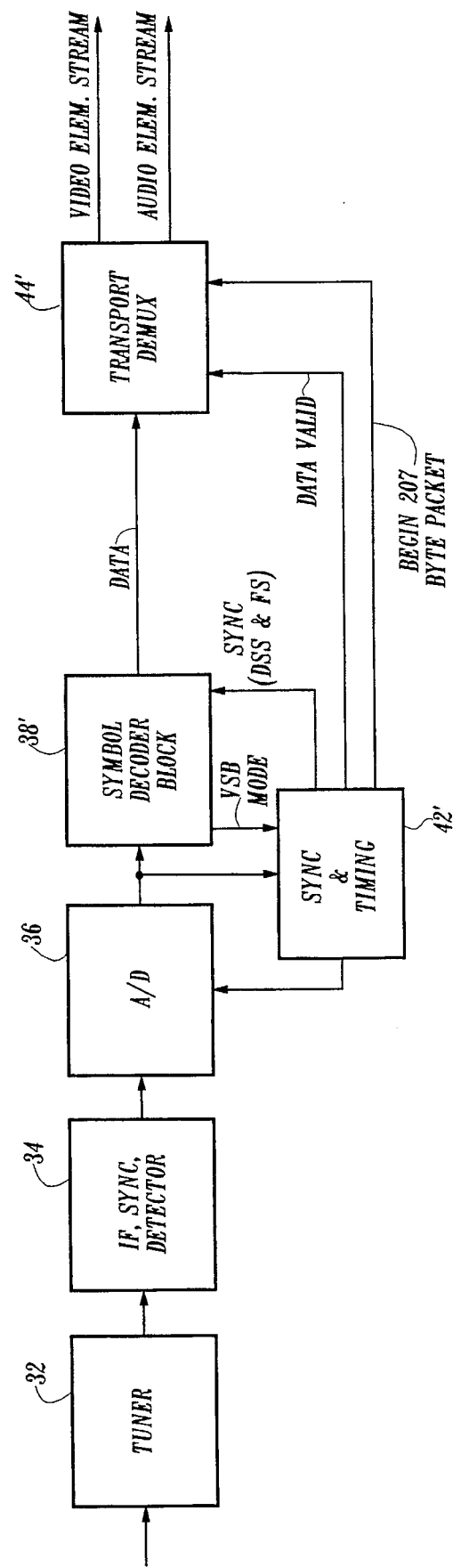
FIG. 6 is a simplified block diagram of an alternate form of a receiver.

Referring to FIG. 2, an ATV signal source 10 is coupled to an MPEG video compressor 12 and to an audio compressor 14, both of which in turn supply an MPEG transport multiplexer 16. Transport multiplexer 16 is also supplied with the output of an auxiliary data source 13. The outputs of MPEG video compressor 12 and audio compressor 14 are packetized elementary streams (PES) of variable length packets of compressed video and audio data complete with their own headers and synchronizing information. These are well known in the art. In the MPEG transport multiplexer 16, the PES signals and auxiliary data are formatted into fixed length MPEG data transport packets of 188 bytes, including a 4 byte header having a 1 byte MPEG sync. The multiplexed compressed MPEG transport signals are supplied to a block 18 labelled MPEG sync byte remover where the MPEG sync byte is removed from each MPEG transport packet. In this regard, it will be appreciated that the functions of blocks 16 and 18 may be combined to directly produce the 187 byte packets developed at the output of MPEG sync byte remover 18. The output of block 18 is applied to a block 20, which includes a symbol encoder, an R-S encoder, an interleaver and a randomizer where the compressed data is encoded and processed as multilevel symbols (depending upon the VSB mode) and applied to a multiplexer 24. The R-S encoder adds 20 R-S error correction bytes to each transport packet which therefore comprises 207 bytes (188-1 +20). A sync generator 22 adds data segment sync (DSS) and field sync (FS) to the encoded symbols for providing an output at multiplexer 24 having the format shown and previously discussed in connection with FIG. 1. This output is then applied to a block 26 where a pilot (DC offset) is inserted. The output of pilot inserter 26 is coupled to a VSB modulator 28 and that in turn is coupled to an RF upconverter 30 for transmission of the signal. As previously mentioned, the VSB transmission is of a suppressed carrier form, with the pilot being inserted at the frequency of the suppressed carrier.

FIG. 3A illustrates a conventional MPEG transport packet which consists of 188 bytes including a 4 byte header at the beginning of the packet, with the first byte of the header being the MPEG sync byte. The header also includes a 13 bit packet identifier (PID) and the complete packet includes the 4 byte header and a 184 byte payload.

In FIG. 3B, the MPEG transport packet of FIG. 3A is shown with the MPEG sync byte removed as shown in FIG. 2. This 187 byte packet consists of a 3 byte header and a 184 byte payload. The 20 FEC bytes are added to this modified MPEG transport packet by symbol encoder 20 for a total of 207 bytes for transmission. Each transport packet therefore constitutes a R-S error correction block of 207 bytes. The modified transport packets are assembled into the VSB frame format consisting of two fields of 313 data segments with 832 symbols per data segment including a four symbol data segment sync by multiplexer 24 for eventual transmission. The VSB field syncs occupy the first data segment in each field (see FIG. 1).

An ATV receiver is shown in FIG. 4. A tuner 32 tunes the received RF signal from the transmitter and supplies it to an IF synchronous detector block 34 where the signal is detected. In this block, carrier recovery is performed on the small pilot carrier by an FPLL circuit (not shown). The output of detector 34 is supplied to an A/D converter 36 which in turn supplies a symbol decoder block 38, the output of which comprises received transport packets without the MPEG sync byte and which is coupled to an MPEG sync reinsertion circuit 40. A/D 36 supplies a sync and timing circuit 42 where the repetitive data segment syncs are detected from the synchronously detected random data. A properly phased 10.7 MHz symbol clock is developed for controlling the A/D converter 36, and data segment sync (DSS) and field sync (FS) are applied to symbol decoder block 38 for recovering the binary data that the symbols represent. The VSB mode signal is recovered in symbol decoder block 38 and supplied to sync and timing circuit 42. In the processing in symbol decoder block 38, FEC is performed and the signal is deinterleaved and derandomized. Timing control signals are applied to MPEG sync reinsertion block 40 for enabling the proper reinsertion of the MPEG sync byte in each processed transport packet. The output of MPEG reinsertion block 40 is therefore in the standard MPEG transport packet format (188 bytes including a 4 byte header) which is applied to a transport demultiplexer 44 for separation of the MPEG compressed video and the compressed audio (as well as any auxiliary data) into the variable length PES packets. The video PES packets are applied to an MPEG video decompressor 46 which in turn supplies a D/A converter 48, the output of which constitutes the video information. The audio PES packets from transport demultiplexer 44 are applied to an audio decompressor 50 and thence to a D/A converter 52.

To summarize, the transmitted data is recovered at the receiver in response to the field and data segment sync signals, and a timing signal is developed that is used to identify the MPEG sync byte reinsertion points. The 20 FEC bytes are used for error correction and the signal is deinterleaved and derandomized. Then the MPEG sync byte is reinserted in each error corrected 187 byte packet to provide the standard 188 byte MPEG packets which are processed by the transport demultiplexer.

FIGS. 5A, 5B, 5C and 5D illustrate, respectively, the input signals to the decoder block 38 and the corresponding output signals to the transport demultiplexer 44 for the 4, 8, 16 and 2 VSB signals with the various numbers on the figures representing bytes. The upper signal of each pair represents two segments of the input VSB signal each comprising 4 DSS symbols and 828 data symbols, whereas the lower signal represents the reconstituted 188 byte MPEG transport packets with the 1 byte MPEG sync reinserted, plus the 20 FEC bytes. For the four VSB system in FIG. 5A, both the data segment sync and the MPEG sync are 1 byte clock in duration. Because of this 1:1 relationship, each data packet is delayed by one byte to permit reinsertion of the MPEG sync byte (represented by the letter "S" in FIGS. 5A–5D). In FIG. 5D, which represents a 2 VSB signal, the data segment sync is one-half byte clock in duration and two full data segments are required for one 207 byte transport packet. In this mode, each packet is delayed one byte clock for every two data segments to permit appropriate reinsertion of the MPEG sync byte. In FIG. 5C, each data segment sync is two byte clocks in duration and each data segment represents two 207 byte transport packets. Consequently, the first data packet is delayed by one byte clock for insertion of the MPEG sync byte. Since the second data packet occurs before another DSS, the second data packet is delayed by an additional type clock for insertion of the MPEG sync byte. This pattern is repeated for subsequent data segment pairs. In FIG. 5B, the data segment sync is 1.5 byte clocks in duration two data segments represent three data packets. The first data packet is delayed one byte clock for MPEG sync insertion. The second packet begins before another DSS so that the packet is delayed an additional byte clock for insertion of the MPEG sync byte. The third packets begins after the next DSS which delays the input by 1.5 byte clocks. Insertion of the third MPEG sync byte causes a third byte clock delay, but since the input has been delayed by 1.5 byte clocks, the net delay is only 1.5 byte clocks (3–1.5). This sequence repeats at the beginning of the next packet as an additional one byte clock delay is added to the output for MPEG sync byte insertion for a total of 2.5 bytes. An additional 1.5 byte clock delay DSS delay is added to the input yielding a net delay of 1 byte clock (2.5–1.5).

FIG. 6 is another embodiment of the invention. The VSB segment sync and field sync are used in the symbol decoder block 38' of this receiver to develop the data, i.e. the binary data represented by the encoded symbols. A data valid signal and a begin 207 byte packet signal are developed by sync and timing circuit 42' for transport demultiplexer 44'. The begin 207 byte packet signal marks the beginning of each of the 207 byte packets of the VSB signal and the data valid signal is inactive during the 20 FEC bytes of each packet. It will be understood that the begin 207 byte packet signal will be generated by symbol decoder block 38' in response to the DSS and FS as follows:

For 2 VSB—at the beginning of every other data segment.

For 4 VSB—at the beginning of every data segment.

For 8 VSB—three evenly spaced times during each pair of data segments, starting with the beginning of the first data segment.

For 16 VSB—twice each data segment, starting at the beginning of each segment.

The data valid signal supplied to demultiplexer 44' identifies the valid 187 bytes of each packet, the 20 FEC bytes, if present, being ignored. With this receiver arrangement, the MPEG sync byte is not inserted, which results in a further simplification. While the transport demultiplexer 44' is not a standard MPEG unit and needs to be set up to operate with these signal inputs, the design is well within the ability of one of ordinary skill in the art.

In FIG. 7, the MPEG sync reinsertion block 40 of FIG. 4 is divided into its constituent blocks. They consist of an MPEG sync pattern generator 54 which supplies its output (47 HEX) to the A input of a multiplexer 56. The B input of multiplexer 56 is supplied from a programmable delay circuit 58 that receives data from symbol decoder block 38. Delay circuit 58 receives an input D from circuit 42 that varies in accordance with the VSB mode as described above. The delay produced by delay circuit 58 is thus variable with input D and in accordance with the diagrams in FIGS. 5A, 5B, 5C and 5D, is determined by the VSB mode. The timing signal from sync and timing block 42 controls the operation of multiplexer 56 so that the MPEG sync pattern is supplied at the appropriate time to the data stream to reconstruct the MPEG transport packets for application to the transport demultiplexer 44.

What has been described is a novel system for transmitting and receiving ATV signals utilizing MPEG transport packets. It is recognized that numerous changes in the described embodiment of the invention will be apparent to those skilled in the art without departing from its true spirit and scope. The invention is to be limited only as defined in the claims.

What is claimed is:

1. A method of transmitting a digital multilevel symbol signal comprising:

encoding elementary streams of data into a multilevel symbol signal comprising a plurality of multiplexed fixed length data packets without packet sync information;

arranging the data packets in fields of repetitive data segments, each of the data segments including a data segment sync and each of the fields including a field sync; and transmitting the fields of data segments.

2. The method of claim 1 further comprising:

receiving the transmitted fields of data segments;

using the data segment sync to identify the beginning of each of the fixed length data packets; and recovering the elementary streams of data from the fixed length data packets in response to the identifying step.

3. The method of claim 1 wherein the elementary streams of data comprise compressed video and compressed audio.

4. The method of claim 1 further comprising:

receiving the transmitted fields of data segments; and using the data segment sync to develop a packet sync signal at the beginning of each received data packet;

recovering the elementary streams from the fixed length data packets including the packet sync signal.

5. The method of claim 1 further comprising:

adding a pilot in the form of a DC offset to the multilevel symbol signal; and

VSB modulating the packets for transmission.

6. In combination:

means for formatting a plurality of data signals into a plurality of multiplexed fixed length transport packets without packet sync information;

means for encoding said transport packets into multilevel symbols;

means for arranging said transport packets into fields of repetitive data segments, each of said data segments including a data segment sync signal and each of said fields including a field sync signal; and means for transmitting said fields of data segments.

7. The combination of claim 6 further comprising adding a pilot in the form of a DC offset to said transmitted signal.

8. The combination of claim 6 further including:

means for receiving said transmitted fields of data segments;

means responsive to said data segment sync signal for generating a timing signal representing the beginning of each of said fixed length packets; and means responsive to said timing signal for recovering said digital data from said fixed length packets.

9. The combination of claim 8 further including:

means responsive to said timing signal for inserting a packet sync signal at the beginning of each of said received fixed length packets.

10. A method of receiving an ATV signal having compressed video and compressed audio in the form of elementary streams of data formatted in a plurality of fixed length transport packets, without packet sync information, said transport packets being encoded as multilevel symbols and being arranged in fields of repetitive data segments, each of the data segments including a data segment sync and each of the fields including a field sync comprising:

receiving and demodulating the transport packets;

recovering the data segment syncs;

using the recovered data segment syncs to identify the beginning of each of the transport packets; and recovering the elementary streams from the transport packets in response to the identifying step.

11. The method of claim 10 further comprising developing a timing signal in the identifying step; and inserting a packet sync signal at the beginning of each of the transport packets in response to the timing signal.

12. A receiver for receiving a plurality of multiplexed fixed length transport packets without packet sync information arranged in fields of repetitive data segments, each data segment including a data segment sync and each field including a field sync and encoded as multilevel symbols comprising:

means for demodulating said received transport packets;

means for recovering said data segment sync;

means for generating a timing signal responsive to said data segment sync; and means for recovering said transport packets under control of said timing signal.

13. The receiver of claim 12 wherein said timing signal identifies the beginning of each of said transport packets; and means for demultiplexing said recovered transport packets.

14. The receiver of claim 12 further comprising:

means responsive to said timing signal for inserting a packet sync signal at the beginning of each said transport packets; and means for demultiplexing said transport packets.

15. A method of transmitting a digital multilevel symbol signal comprising:

multiplexing elementary streams of variable length data into fixed length transport packets of MPEG format;

removing the MPEG sync information from the transport packets;

encoding the transport packets into multilevel symbols;

arranging the transport packets in fields of repetitive data segments, each of the data segments including a data segment sync and each of the fields including a field sync; and transmitting the fields of data segments.

16. The method of claim 15 further comprising:

receiving the transmitted fields of data segments;

using the data segment sync to generate a timing signal;

reinserting the MPEG sync information in the transport packets responsive to said timing signal; and recovering the elementary streams of variable length data.

17. The method of claim 15 wherein the elementary streams of variable length data comprise compressed MPEG video and compressed audio.

18. The method of claim 17 further comprising:

adding a pilot in the form of a DC offset; and

VSB modulating the fields of data segments for transmission.

19. The method of claim 16 further comprising delaying the recovered transport packets when reinserting the MPEG sync information.

20. In combination:

means for formatting compressed MPEG video and audio information in the form of elementary streams of data into a plurality of multiplexed fixed length MPEG transport packets, each having MPEG sync information;

means for removing said MPEG sync information from said MPEG transport packets;

means for encoding said transport packet into multilevel symbols;

means for arranging said transport packets into fields of repetitive data segments, each of said data segments including a data segment sync and each of said fields including a field sync; and means for transmitting said fields of data segments as a VSB modulated signal.

21. The combination of claim 20 further comprising adding a pilot in the form of a DC offset to said fields of data segments.

22. The combination of claim 20 further including:

means for receiving said transmitted fields of data segments;

means for generating a timing signal responsive to said data segment sync; and means for reinserting said MPEG sync information in said transport packets responsive to said timing signal.

23. A method of receiving an ATV signal having MPEG compressed video and compressed audio in the form of elementary streams of data formatted in a plurality of fixed length MPEG transport packets, with the MPEG sync information removed, the transport packets being encoded as multilevel symbols and being arranged in fields of repetitive data segments, each of the data segments including a data segment sync and each of the fields including a field sync comprising:

receiving and demodulating the transport packet;

recovering the data segment syncs;

generating a timing signal responsive to the recovered data segment syncs; and reinserting the MPEG sync information in the transport packets responsive to the timing signal.

24. The method of claim 23 further comprising demultiplexing the transport packets with the reinserted MPEG sync information to recover the elementary streams of data.

25. A receiver for receiving a plurality of multiplexed fixed length MPEG format transport packets without packet sync information, including compressed MPEG video and compressed audio arranged in fields of repetitive data segments, each of said data segments including a data segment sync and each of said fields including a field sync and encoded as multilevel symbols comprising:

means for demodulating said received transport packets;

means for recovering said data segment sync;

means for generating a timing signal responsive to said data segment sync identifying the beginning of each of said transport packets; and means for recovering said transport packets in response to said timing signal.

26. The receiver of claim 25 further comprising means for demultiplexing said recovered transport packets.

* * * * *